United States Patent
Ikedo (10) Patent No.: US 7,460,843 B2
(45) Date of Patent: Dec. 2, 2008

(54) AMPLIFIER APPARATUS, POLAR MODULATION TRANSMISSION APPARATUS AND WIRELESS COMMUNICATION APPARATUS

(75) Inventor: Taichi Ikedo, Yokohama (JP)

(73) Assignee: Panasonic Corporation, Osaka (JP)

( * ) Notice: Subject to any disclaimer, the term of this patent is extended or adjusted under 35 U.S.C. 154(b) by 494 days.

(21) Appl. No.: 11/377,279

(22) Filed: Mar. 17, 2006

(65) Prior Publication Data

US 2006/0234655 A1    Oct. 19, 2006

(30) Foreign Application Priority Data

Mar. 17, 2005  (JP) .............................. 2005-076898

(51) Int. Cl.
*H01Q 11/12* (2006.01)
*H04B 1/04* (2006.01)

(52) U.S. Cl. ................. 455/127.1; 455/114.2; 375/297; 330/127

(58) Field of Classification Search .................... 455/91, 455/108, 110, 114.2, 127.1, 127.2, 572; 375/295, 375/296, 297, 300, 302; 330/113, 127, 129, 330/130, 136
See application file for complete search history.

(56) References Cited

U.S. PATENT DOCUMENTS

| | | | | |
|---|---|---|---|---|
| 5,454,013 | A * | 9/1995 | Minami et al. .............. | 375/297 |
| 6,735,419 | B2 * | 5/2004 | Mitzlaff .................... | 455/127.1 |
| 6,980,831 | B2 | 12/2005 | Matsuyoshi et al. | |
| 7,135,918 | B1 * | 11/2006 | Outaleb et al. .............. | 330/136 |
| 7,157,963 | B1 * | 1/2007 | Booth et al. .................. | 330/10 |
| 7,276,985 | B2 * | 10/2007 | Hirano ....................... | 332/128 |
| 7,298,308 | B1 * | 11/2007 | Rueger et al. ............... | 341/143 |
| 7,421,037 | B2 * | 9/2008 | Shakeshaft et al. ......... | 375/295 |

FOREIGN PATENT DOCUMENTS

JP    10-256843    9/1998
JP    2001-156554    6/2001

OTHER PUBLICATIONS

English language Abstract of JP 10-256843.
English language Abstract of JP 2001-156554.

* cited by examiner

*Primary Examiner*—Quochien B Vuong
(74) *Attorney, Agent, or Firm*—Greenblum & Bernstein, P.L.C.

(57) ABSTRACT

A quantizer 122, and a plurality of down-samplers 124-1 to 124-N down-sampling the quantized output at a speed of (1/N) of the sampling rate of the quantizer 122 and shifting the respective phases by (360/N) degrees so as to provide a latched output, are provided. As a result, it is possible to carry out the same operation as for a polyphase quantizer using the down-samplers 124-1 to 124-N with a small circuit scale, while avoiding the variations in characteristics that occur as a result of using a polyphase quantizer.

8 Claims, 10 Drawing Sheets

3 POWER SUPPLY VOLTAGE CONTROL SECTION

TIME

AMPLIFIER APPARATUS, POLAR MODULATION TRANSMISSION APPARATUS AND WIRELESS COMMUNICATION APPARATUS

BACKGROUND OF THE INVENTION

1. Field of the Invention

The present invention relates to amplifier apparatus that has: a non-linear high-frequency power amplifier amplifying a first input signal; and a power supply voltage control section receiving as input an external power supply and forming a power supply voltage for the high-frequency amplifier based on a second input signal, and that amplifies the signal level of the first input signal using the high-frequency power amplifier to a level corresponding to the second input signal, and the present invention furthermore relates to polar modulation transmission apparatus and wireless communication apparatus mounted with this kind of amplifier apparatus.

2. Description of the Related Art

In the related art, there has typically been a trade off relationship between power efficiency and linearity in the design of amplifier apparatus employed as linear transmission modulators. However, recently, amplifier apparatus have been proposed that make possible both high efficiency and linearity in linear transmission modulators by using polar modulation.

Figure 1:
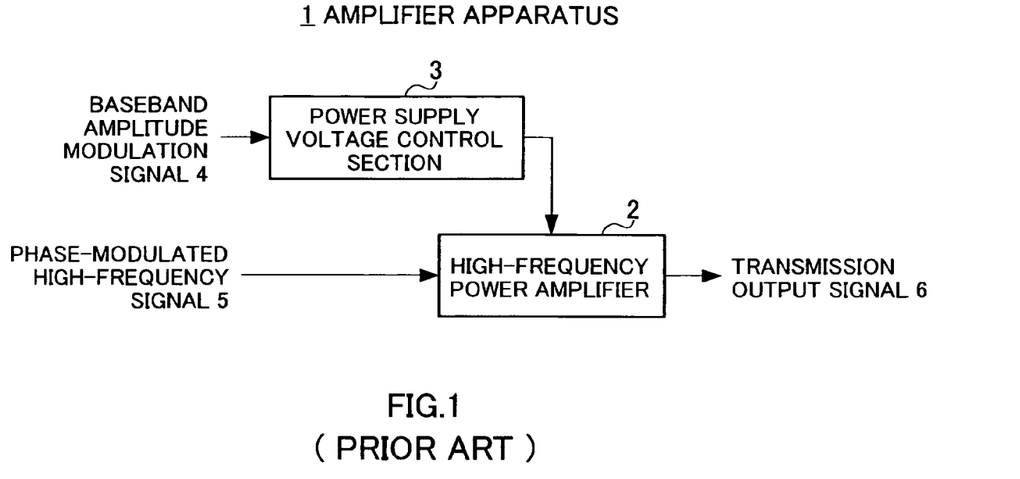
FIG. 1 is a block diagram showing an example configuration for amplifier apparatus of the related art.

FIG. 1 is a block diagram showing an example configuration of amplifier apparatus to which polar modulation is applied. Amplifier apparatus 1 is configured so as to have non-linear high-frequency power amplifier 2 and power supply voltage control section 3.

A baseband amplitude modulation signal (for example, $\sqrt{(I^2+Q^2)}$) 4 split from a baseband modulation signal by an amplitude phase splitting section (not shown) is input to power supply voltage control section 3. Power supply voltage control section 3 then forms a power supply voltage for high-frequency power amplifier 102 based on baseband amplitude modulation signal 4. The power supply voltage formed by power supply voltage control section 3 is then supplied to high-frequency power amplifier 2.

A phase-modulated high-frequency signal 5 is input to high-frequency power amplifier 2. The phase-modulated high-frequency signal 5 is obtained by first splitting the phase component of a baseband modulation signal (for example, an angle between a modulation symbol and I axis) using an amplitude phase splitting section (not shown), and then modulating a carrier frequency signal using this phase component.

High-frequency power amplifier 2 is composed of a non-linear amplifier, amplifying a signal resulting from multiplying a power supply voltage value and phase-modulated high-frequency signal 5 by the gain of the high-frequency power amplifier 2, and outputting this as a transmission output signal 6. Transmission output signal 6 is sent from an antenna (not shown).

By using a polar modulation scheme in this way, it is possible to make the phase-modulated high-frequency signal 5 inputted to the high-frequency power amplifier 2 into a constant-envelope signal having no fluctuation component in amplitude directions. It is therefore possible to use a high-efficiency non-linear amplifier as high-frequency power amplifier 2. As a result, the amplifier apparatus 1 of the configuration of FIG. 1 makes possible both high-efficiency and linearity.

However, in order for power efficiency to be a maximum, it is often the case that power supply voltage control section 3 is implemented using a switching mode power supply having a D-class amplifier as an output stage. As cases where a normal switching mode power supply is implemented using pulse width modulation are common, the output of this kind of power supply is such that the ratio of Hi (high level)/Lo (low level) becomes a rectangular wave representing baseband amplitude modulation signal 4.

Figure 2:
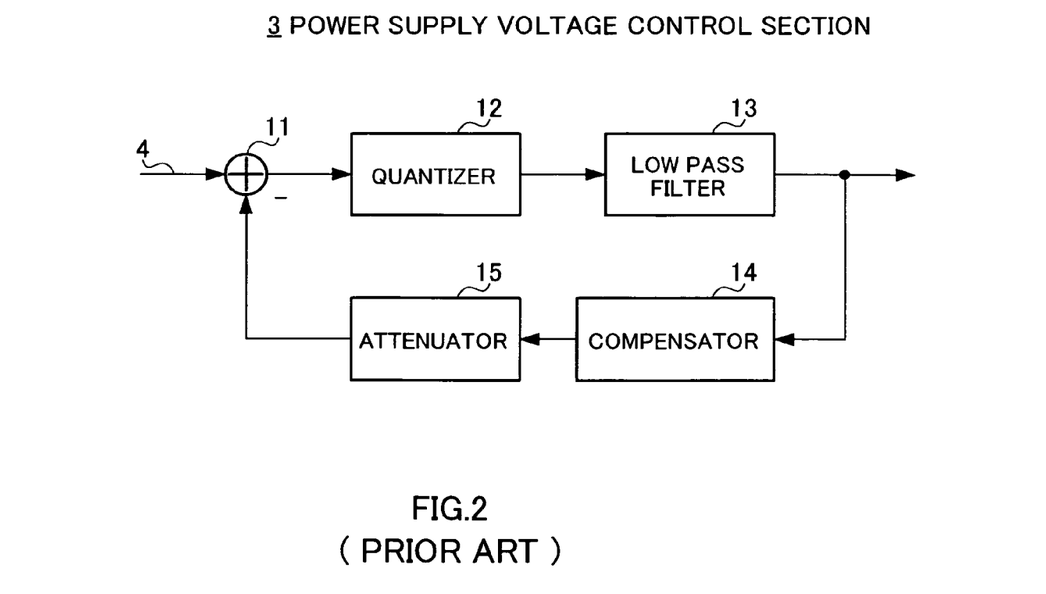
FIG. 2 is a block diagram showing an example configuration for a power supply voltage control section of the related art.

However, when pulse width modulation is carried out at the power supply voltage control section 3 as described above, intermodulation distortion occurs in the transmission output signal. As technology to resolve this, as shown in FIG. 2, power supply voltage control section 3 has been given a delta modulator configuration composed of an adder 11, quantizer 12, low pass filter 13, compensator 14, and attenuator 15, with the baseband amplitude modulation signal 4 being delta-modulated and supplied to the high-frequency power amplifier 2 (for example, refer to paragraphs 0008-0009 and FIG. 11 of Laid-Open Japanese Patent Application Publication No. Hei. 10-256843). As a result, it is possible to improve the distortion appearing in the transmission output signal 6 by implementing the utilization of delta modulation for the switching mode power supply and using a negative feedback loop for this delta modulation.

However, large current switching is necessary for the quantizer 12 to drive the high-frequency power amplifier 2. Further, when the frequency band of baseband amplitude modulation signal 4 inputted to power supply voltage control section 3 is broad, it is necessary for the sampling rate of quantizer 12 to be a high-speed. Typically, the large current operation and high-speed operation of a switching element has a trade-off relationship, and this makes design of quantizer 12 requiring both a large current and high-speed switching operation extremely difficult.

Figure 3:
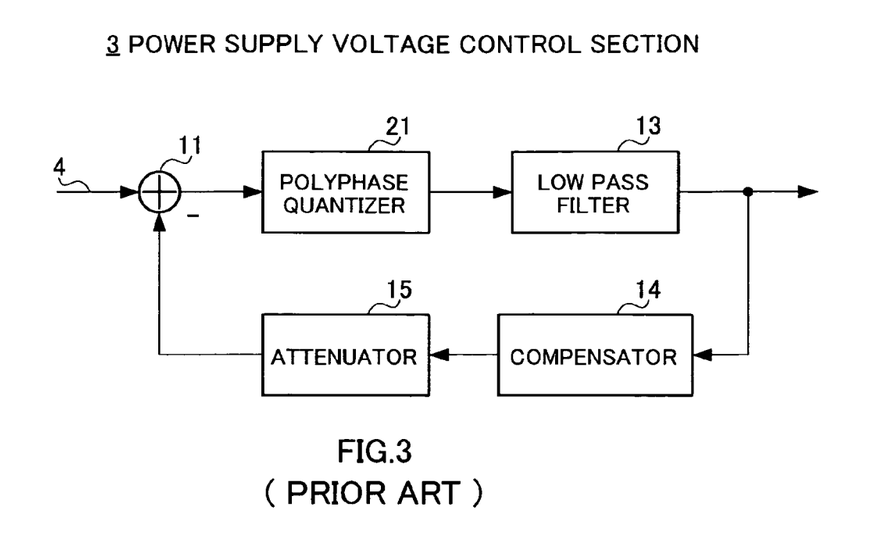
FIG. 3 is a block diagram showing an example configuration for a power supply voltage control section of the related art.
Figure 4:
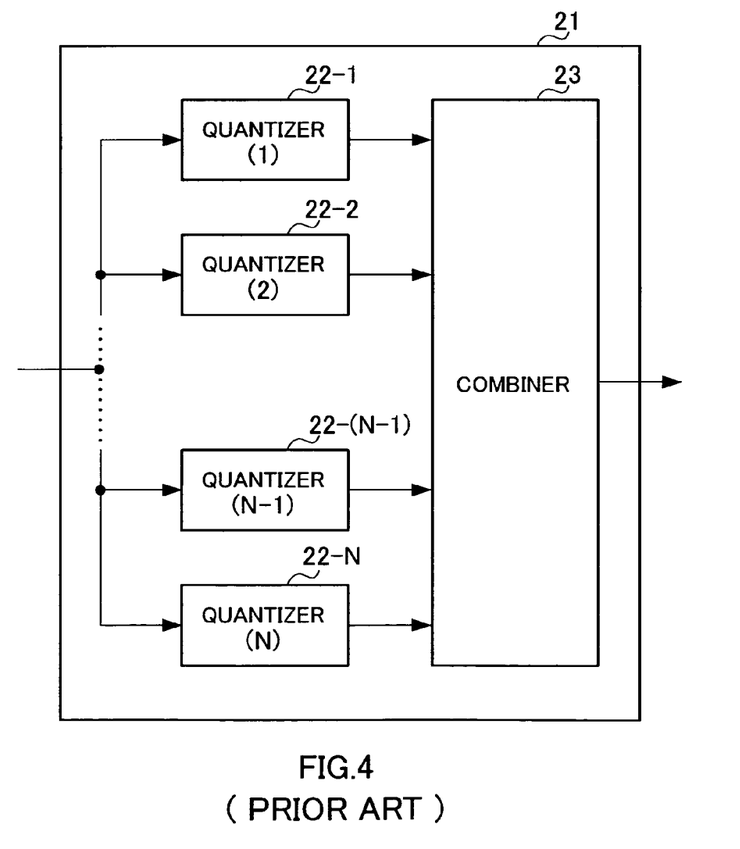
FIG. 4 is a block diagram showing an example configuration for a polyphase quantizer.
Figure 5A:
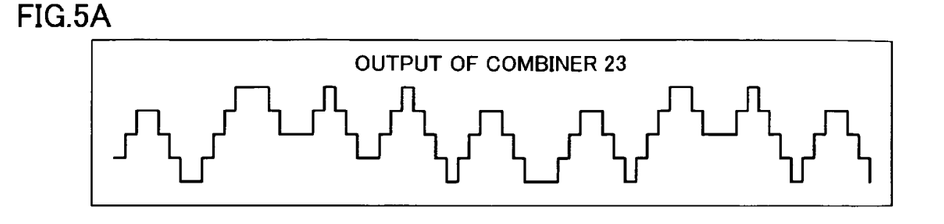
FIG. 5A shows an output of a combiner.
Figure 5B:
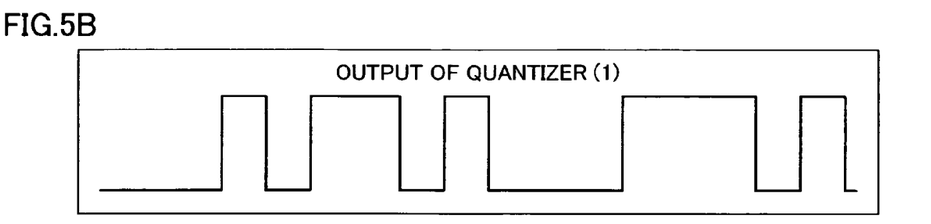
FIG. 5B to FIG. 5E show outputs of quantizers.
Figure 5C:
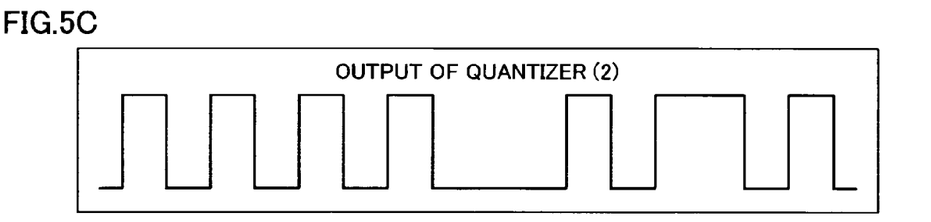
Figure 5D:
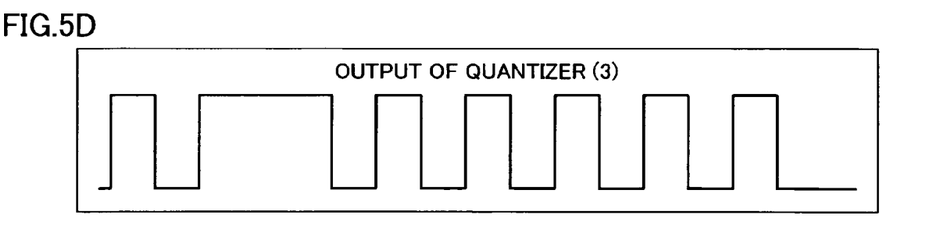
Figure 5E:
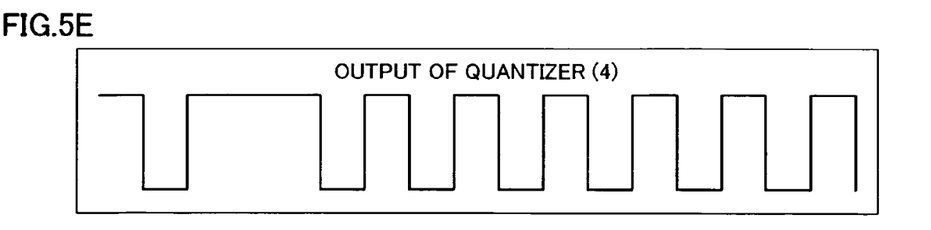

Therefore, as shown in FIG. 3, there has been proposed a digital modulator configuration where power supply voltage control section 3 employs a polyphase quantizer 21 (for example, refer to paragraph 0010-0012 and FIG. 12 of Laid-Open Japanese Patent Application Publication No. 2001-156554). As shown in FIG. 4, polyphase quantizer 21 is configured with N quantizers (1 to N) 22-1 to 22-N. Each of the quantizers 22-1 to 22-N operates on a phase shift of (360/N) degrees at a speed of (1/N) with respect to the sampling rate in the event of configuring a delta modulator using one quantizer as shown in FIG. 2. Outputs of quantizers 22-1 to 22-N are combined by combiner 23. For ease of description, a description will be given of the case of providing combiner 23 directly after quantizers 22-1 to 22-N, but it is also possible to provide a low pass filter between the quantizers 22-1 to 22-N and the combiner 23 and combine after passing outputs of the quantizers 22-1 to 22-N through the low pass filter.

FIG. 5 shows waveforms for the operation (in the case of N=4) of the polyphase quantizer 21. The final output waveform of polyphase quantizer 21 is of the form shown in FIG. 5A, and combined waveforms of the outputs of the plurality of quantizers 22-1 to 22-N are as shown in FIG. 5B to FIG. 5E. By using this kind of polyphase quantizer 21, it is possible to reduce the speed of quantizers 22-1 to 22-N so as to moderate the requirements on the quantizers 22-1 to 22-N, and amplitude modulation of a broader bandwidth is possible with power supply voltage control section 3.

Unfortunately, when a polyphase quantizer is used, the multiphase configuration requires a greater number of quantizers, and this brings about a corresponding increase in circuit scale. Further, in the event that the quantizer is configured with an analog circuit, characteristic deterioration occurs as a result of variation in characteristics between a plurality of quantizers.

SUMMARY OF THE INVENTION

It is therefore an object of the present invention to provide amplifier apparatus, polar modulation transmission apparatus, and wireless communication apparatus capable of forming a power supply voltage of superior characteristics with a simple configuration so as to reduce output distortion of a high-frequency power amplifier by configuring a power supply voltage control section using a delta modulator configuration or a delta sigma modulator configuration, compared to the case of making a quantizer a multiphase configuration.

The present invention achieves the aforementioned embodiment with a configuration where amplifier apparatus having a non-linear high-frequency power amplifier amplifying a first input signal and a power supply voltage control section inputted with an external power supply forming a power supply voltage for the high-frequency amplifier based on a second input signal, amplifying the signal level of the first input signal using the high-frequency power amplifier to a level corresponding to the second input signal, and, in this configuration, the power supply voltage control section has a delta modulator configuration or a delta-sigma modulator configuration and is comprised of a quantizer having quantizing a signal according to a signal level of the second input signal, a plurality of down-samplers down-sampling quantized outputs obtained from the quantizer at lower speed than the sampling rate of the quantizer and with respective phases shifted, and a combiner combining outputs of the plurality of down-samplers.

BRIEF DESCRIPTION OF THE DRAWINGS

The above and other objects and features of the invention will appear more fully hereinafter from a consideration of the following description taken in connection with the accompanying drawings, in which:

FIG. 5 is a waveform diagram illustrating the operation of a polyphase quantizer, where

FIG. 8 is a wave diagram illustrating an operation of a polyphase down-sampler, where

DETAILED DESCRIPTION OF THE PREFERRED EMBODIMENTS

The following is a detailed description with reference to the drawings of preferred embodiments of the present invention.

The following is a description of an example in the event that an amplifier apparatus of the present invention is applied to a polar modulation transmission apparatus.

First Embodiment

Figure 6:
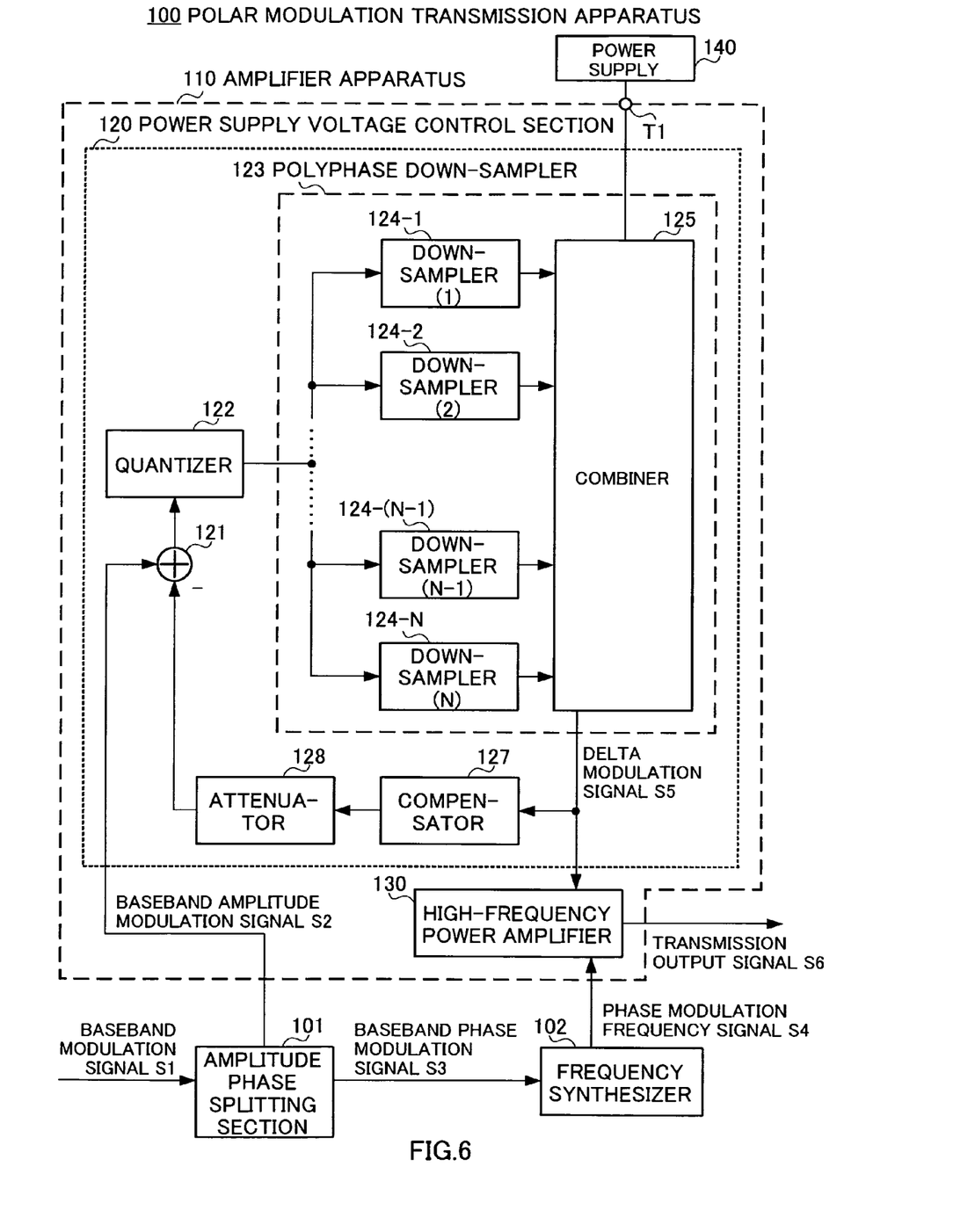
FIG. 6 is a block diagram showing a configuration for polar modulation transmission apparatus to which amplifier apparatus of a first embodiment of the present invention is applied.

A configuration for polar modulation transmission apparatus 100 mounted with amplifier apparatus 110 of a first embodiment of the present invention is shown in FIG. 6. Polar modulation transmission apparatus 100 is used, for example, in mobile terminal apparatus of mobile communication systems, or in base station apparatus carrying out wireless communication with mobile terminal apparatus.

Polar modulation transmission apparatus 100 is comprised of an amplitude phase splitting section 101 splitting a baseband modulation signal S1 into a baseband amplitude modulation signal S2 constituting an amplitude modulation component (for example, $\sqrt{(I^2+Q^2)}$ ) and a baseband phase modulation signal S3 constituting a phase modulation component (for example, an angle between a modulation symbol and an I axis), and a frequency synthesizer 102 phase modulating a high-frequency signal using baseband phase modulation signal S3 for conversion to a phase modulation frequency signal S4.

In addition, polar modulation transmission apparatus 100 has amplifier apparatus 110. Amplifier apparatus 110 is comprised of a non-linear high-frequency power amplifier 130 amplifying phase modulation frequency signal S4 of the output of frequency synthesizer 102, and power supply voltage control section 120 forming power supply voltage (delta modulation signal in the case of this embodiment) S5 for high-frequency power amplifier 130 based on baseband amplitude modulation signal S2 from the power supply voltage of power supply (battery) 140 inputted via power supply terminal T1. High-frequency power amplifier 130 amplifies phase modulation frequency signal S4 using delta modulation signal S5 as a power supply voltage. In other words, this corresponds to combine by multiplying delta modulation signal S5 provided by power supply voltage control section 120 with phase modulation frequency signal S4.

Power supply voltage control section 120 is configured from a delta modulator, acquires delta modulation signal S5 by delta-modulating baseband amplitude modulation signal S2, and outputs this as the power supply voltage for high-frequency power amplifier 130. Power supply voltage control section 120 is comprised of an adder 121, quantizer 122 quantizing an output of adder 121 according to a predetermined threshold value, polyphase down-sampler 123, compensator 127 compensating the amount of feedback while feeding back the output of polyphase down-sampler 123, and attenuator 128 outputting an output of compensator 127 to adder 121 in line with the level of baseband amplitude modulation signal S2.

Polyphase down-sampler 123 is comprised of a plurality of down-samplers 124-1 to 124-N down-sampling the quantization output obtained from the quantizer 122 at a sampling rate that is lower than that of the quantizer 122 and that respectively shift the phases, and a combiner 125 combining the outputs of the plurality of down-samplers 124-1 to 124-N. In this embodiment, each of the down-samplers 124-1 to 124-N is made to operate at a speed of (1/N) with respect to the sampling rate of quantizer 122 and so as to shift the phase by (360/N) degrees.

Figure 7:
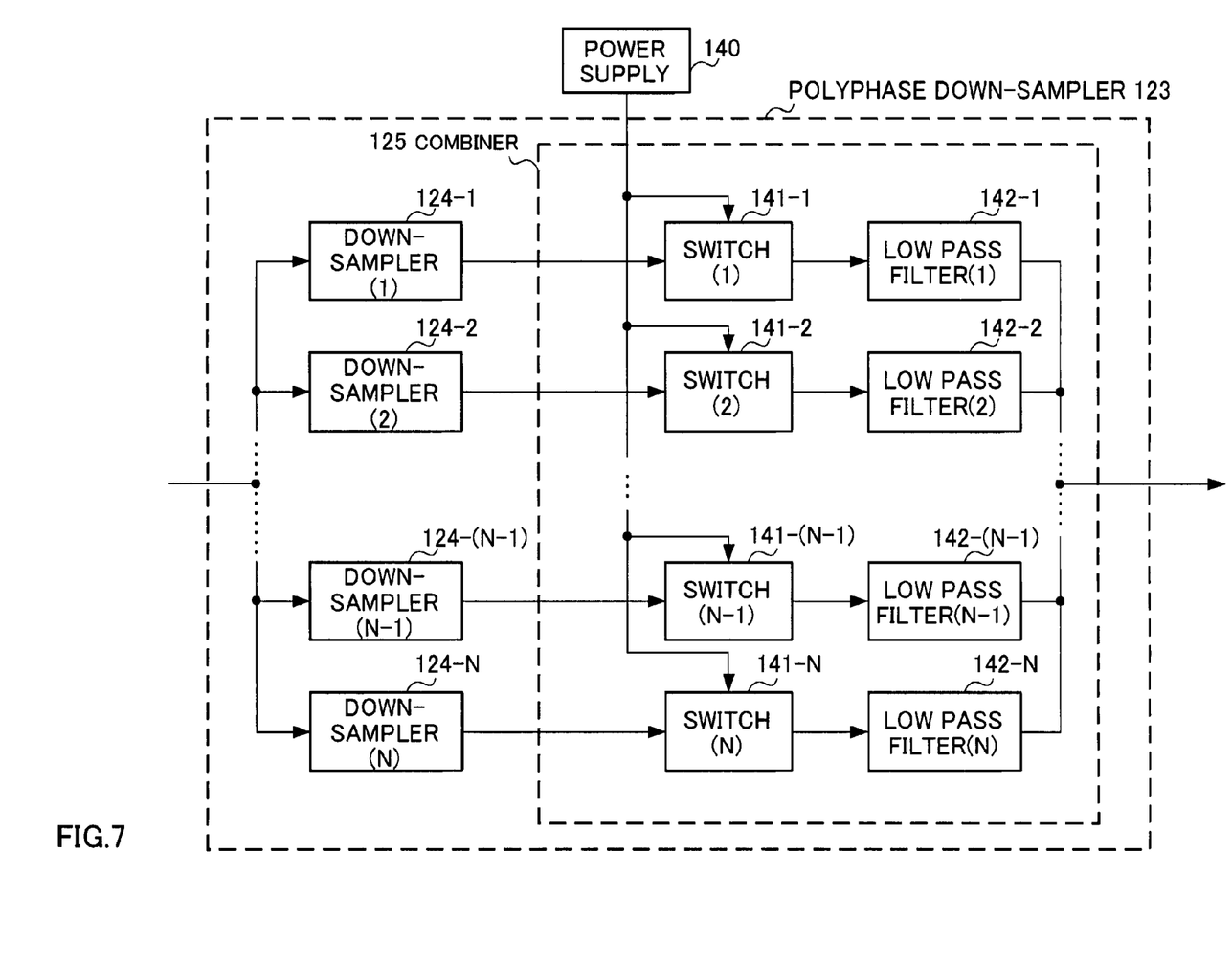
FIG. 7 is a block diagram showing a detailed example configuration of a combiner of the first embodiment.

An example of a specific configuration for combiner 125 is shown in FIG. 7. Combiner 125 is configured from switches 141-1 to 141-N and low pass filters 142-1 to 142-N connected in a cascade at a stage after the down-samplers 124-1 to 124-N. A power supply voltage from power supply 140 and an output for a corresponding down-sampler 124-1 to 124-N is input to each switch 141-1 to 141-N. Each of the switches 141-1 to 141-N is operated to go on and off using an output from a corresponding down-sampler 124-1 to 124-N as a switching control signal. Specifically, in the event that an output from a corresponding down-sampler 124-1 to 124-N is a "High" level, one of the switches 141-1 to 141-N is on and supplies current from power supply 140 to the low pass filter, and in the event of a "Low" level, is off and does not supply current from power supply 140 to the low pass filter. Low pass filters 142-1 to 142-N eliminate quantization noise contained in the outputs of down-samplers 124-1 to 124-N.

Each element of power supply voltage control section 120 may be implemented using an analog circuit or may be implemented using a digital circuit.

Next, a description is given of the operation of this embodiment centered mainly on the operation of amplifier apparatus 110.

Adder 121 of power supply voltage control section 120 adds the inputted baseband amplitude modulation signal S2 and the output of attenuator 128 provided in the feedback loop (in reality, subtraction for negative feedback). Quantizer 122 quantizes the output of adder 121 according to a predetermined threshold value.

Polyphase down-sampler 123 down-samples and latches the output of quantizer 122 using the N down-samplers operating at a speed of (1/N) with respect to the sampling rate of the quantizer 122 and shifting phases by (360/N) degrees, and combines these outputs at combiner 125 for output.

FIG. 8 shows waveforms for the operation (in the case of N=4) of the polyphase down-sampler 123. Outputs obtained by down-sampling and latching the output of quantizer 122 shown in FIG. 8A using the plurality of down-samplers 124-1 to 124-4 are shown in FIG. 8B to FIG. 8E.

Figure 8A:
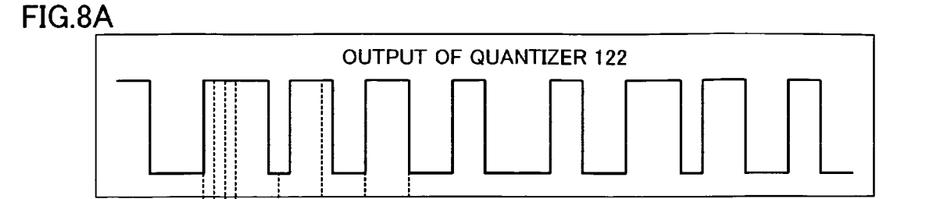
FIG. 8A shows an output of a quantizer.
Figure 8B:
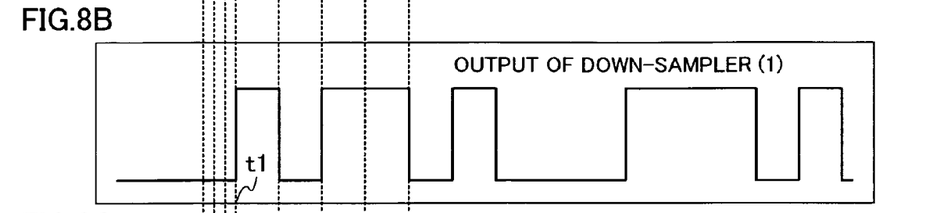
FIG. 8B to 8E show outputs of down-samplers.
Figure 8C:
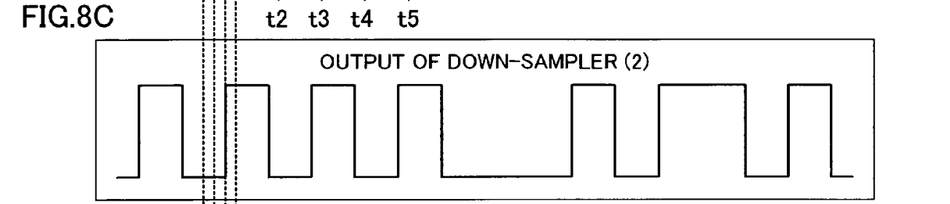
Figure 8D:
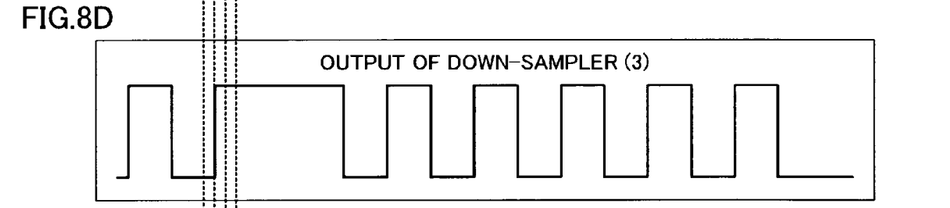
Figure 8E:
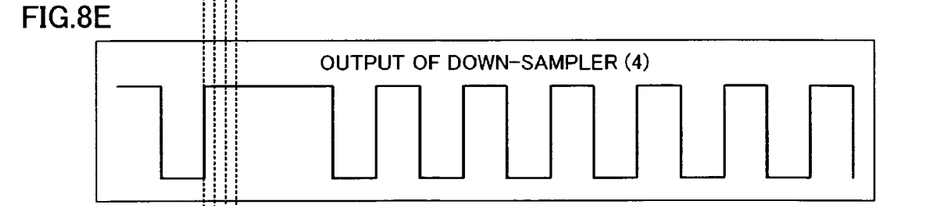

Specifically, a description is given of the operation of down-sampler (1) 124-1 using FIG. 8B. Down-sampler (1) 124-1 carries out sampling operations at times t1, t2, t3, t4, t5, .... When the sampling interval of quantizer 122 is taken to be Q, this sampling interval is Q×N. Down-sampler (1) 124-1 then latches the output "High" until the sampling time t2 because the output of quantizer 122 is "High" at the sampling time t1. Following this, at the sampling time t2, the output "Low" is latched until the sampling time t3 because the output of the quantizer 122 is "Low" at the sampling time t2. In this way, down-sampler (1) 124-1 carries out a sampling and latch operation at a speed of (1/N) of the sampling rate of the quantizer 122. The down-samplers (2) to (4) shown in FIG. 8C to FIG. 8E carry out the same sampling and latching operation each with a phase shifted by (360/N) degrees.

Figure 8F:
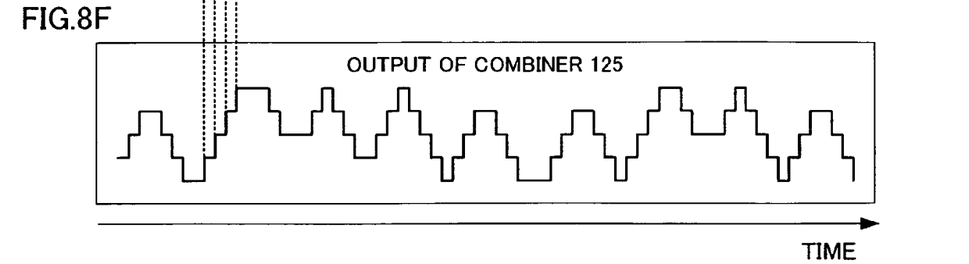
FIG. 8F is a waveform diagram showing an output of a combiner.

As shown in FIG. 8F, a waveform finally obtained from the polyphase down-sampler 123 i.e. an output waveform for the combiner 125 becomes a combined wave of the outputs of the plurality of down-samplers (1) to (4), as shown in FIG. 8B to FIG. 8E. The waveform of FIG. 8F has a waveform where a rectangular wave is formed for the purposes of illustrating the operation of combiner 125 but in reality, a waveform smoothed by a low pass filter inside combiner 125 is outputted.

In this way, by down-sampling and latching the output of quantizer 122 using polyphase down-sampler 123 using N down-samplers operating at a speed of (1/N) with respect to the sampling rate of quantizer 122 and shifting phases by (360/N) degrees, the power supply voltage control section 120 of this embodiment operates in the same way as a polyphase quantizer.

This is to say that each of the down-samplers 124-1 to 124-N completes a simple process of down-sampling a binary signal after quantization, and circuit configuration can therefore be simple compared to quantization of an analog waveform by each quantizer constituting a polyphase quantizer.

Namely, in the configuration of this embodiment, it is necessary for quantizer 122 to operate at an N-times sampling rate compared to the polyphase quantizer of the related art but the output of quantizer 122 does not directly drive high-frequency power amplifier 130 but rather only has to drive the N down-samplers 124-1 to 124-N of quantizer 122. It is therefore not necessary to switch the quantizer 122 using a large current. In other words, large current operation is no longer necessary for quantizer 122 of this embodiment, the trade off between large current operation and high speed operation is avoided, and design of quantizer 122 is therefore simple.

In this way, a single quantizer 122 and the plurality of down-samplers 124-1 to 124-N down-sampling, latching, and outputting this quantization output at a speed of (1/N) of the sampling rate of the quantizer 122 and at a phase shifted by (360/N) degrees are provided at power supply voltage control section 120 of this embodiment without the use of a plurality of quantizers. It is therefore possible to suppress increases in circuit scale compared to the case of using a polyphase quantizer. Further, as quantization is performed using only one quantizer 122, it is possible to suppress deterioration in characteristics due to variations in characteristics of the plurality of quantizers compared to the case of using polyphase quantizers.

The amplifier apparatus 110 is therefore capable of forming a power supply voltage (delta modulation signal S5) of superior characteristics with a simple configuration so as to reduce output distortion of a high-frequency power amplifier 130 by configuring a power supply voltage control section 120 using a delta modulator configuration compared to the case of making a quantizer a multiphase configuration. It is therefore possible to implement a polar modulation transmission apparatus 100 capable of forming a transmission output signal S6 with superior characteristics while using a simple configuration by mounting this amplifier apparatus 110.

In the above embodiment, a description is given of the case of the present invention using power supply voltage control section 120 of a delta modulator configuration but the present invention is by no means limited in this respect, and may similarly be applied to a power supply voltage control section of a delta-sigma modulator configuration. In this case it is possible to provide an integrator between adder 121 and quantizer 122 and input the integrated output of adder 121 to quantizer 122. The same also applies with respect to second and third embodiments described in the following.

In the embodiment described above, a description is given of the case where a plurality of low pass filters 142-1 to 142-N are provided within combiner 125, with combining taking place after current outputted from the switches 141-1 to 141-N passes through low pass filters 142-1 to 142-N. However, this is by no means limiting, and it is also possible to collectively eliminate quantization noise contained in this combined signal using a single low-pass filter after combining the power supply voltages outputted by each of the switches 141-1 to 141-N.

Second Embodiment

Figure 9:
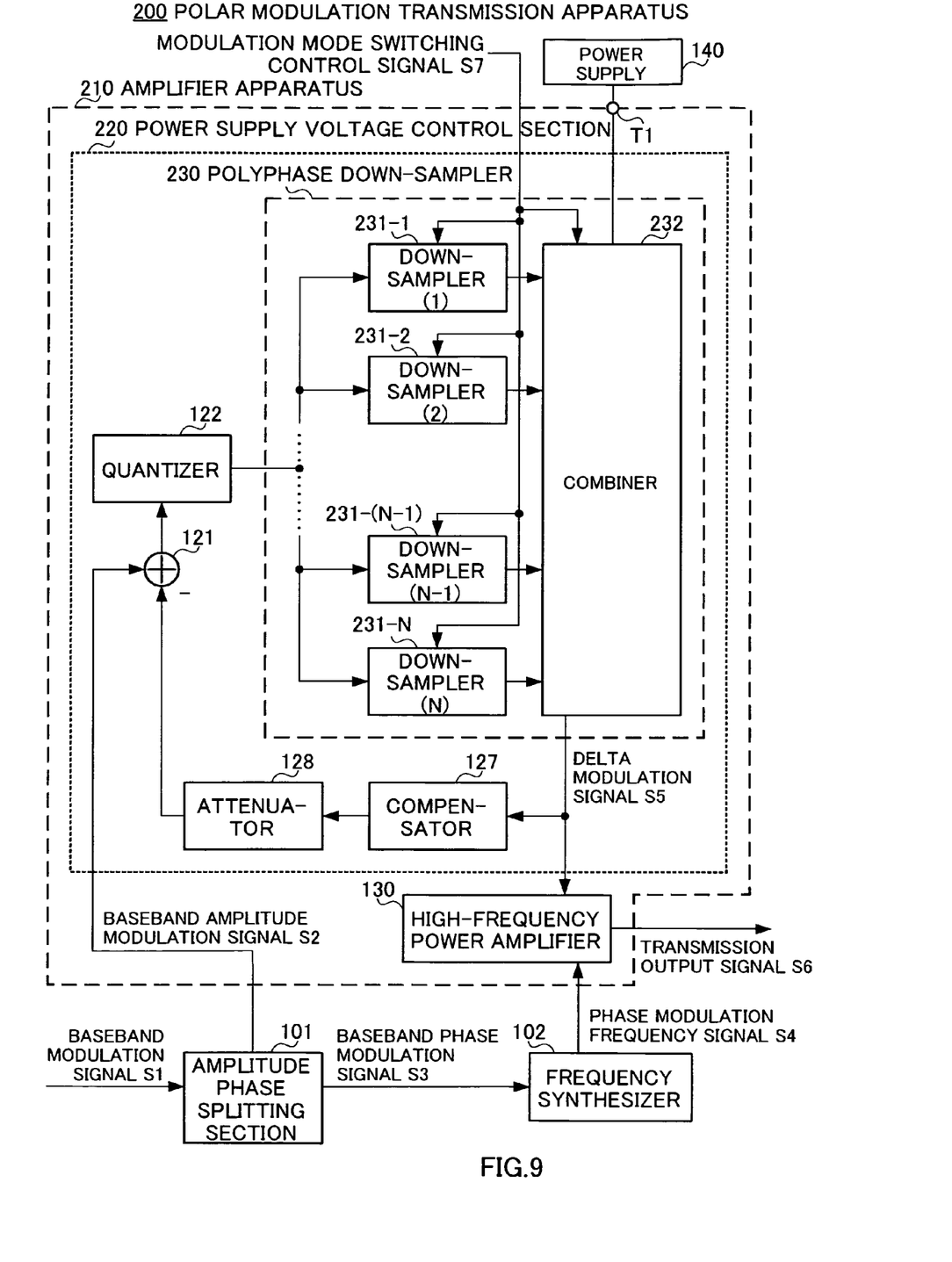
FIG. 9 is a block diagram showing a configuration for polar modulation transmission apparatus to which amplifier apparatus of a second embodiment of the present invention is applied.

A configuration for polar modulation transmission apparatus 200 mounted with amplifier apparatus 210 of a second embodiment of the present invention is shown in FIG. 9, with parts corresponding to FIG. 6 being given the same numerals.

Amplifier apparatus 210 of this embodiment is capable of controlling the number of down-samplers, from within N down-samplers 231-1 to 231-N constituting polyphase down-sampler 230, that actually operate, using modulation mode switching control signal S7. Here, when the number of down-samplers actually made to operate is taken to be n ($\leqq$N), the operating down-samplers down-sample the quantization output at a speed of (1/n) with respect to the sampling rate of the quantizer 122 while shifting the respective phases by (360/n) degrees. That is to say, at polyphase down-sampler 230, the number of down-samplers operating, and the operation speed and extent of phase shifting of the operating down-samples can be varied by modulation mode switching control signal S7 according to the modulation mode (for example, modulation schemes corresponding to the UMTS specification, GSM specification etc.).

Figure 10:
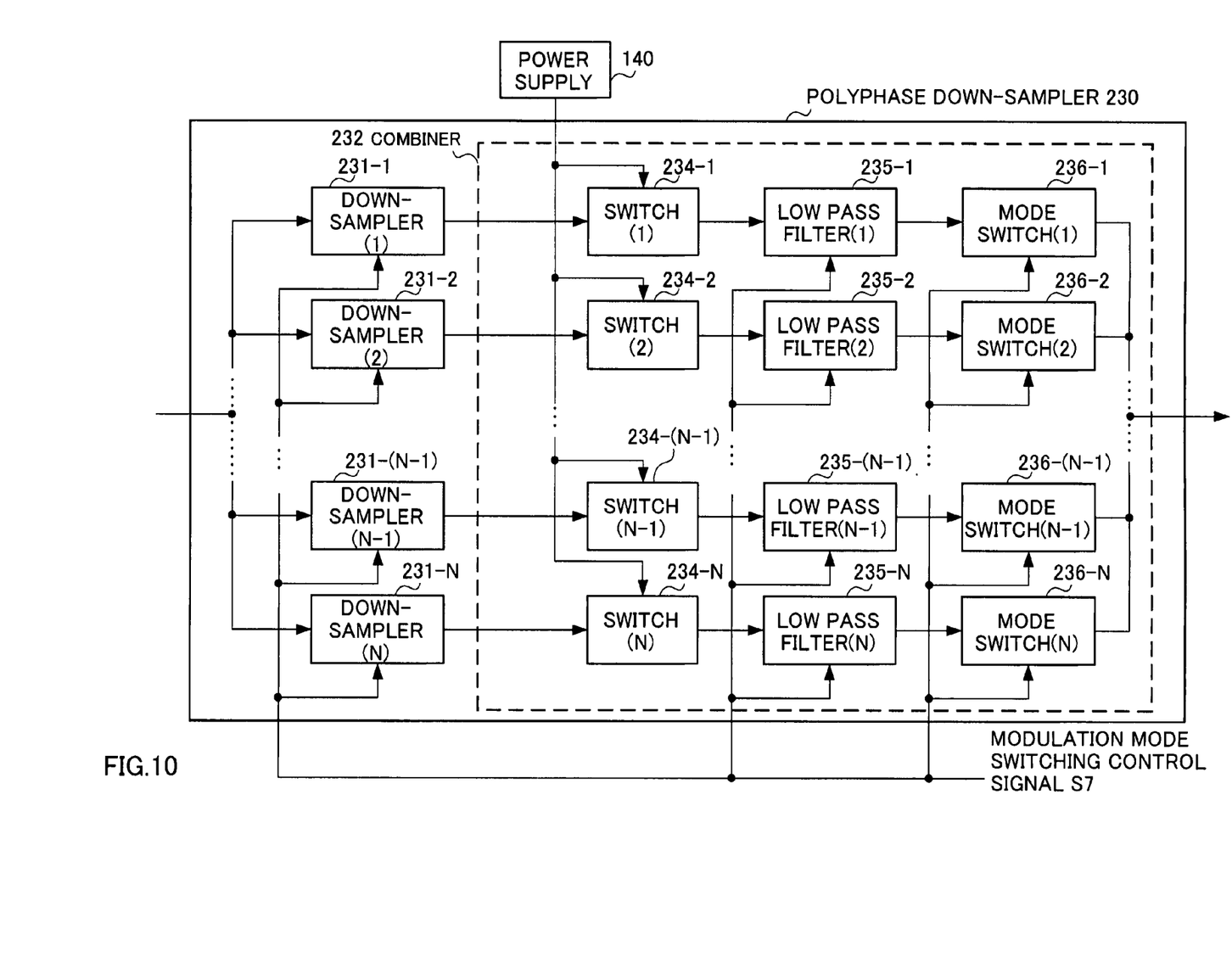
FIG. 10 is a block diagram showing a detailed example configuration of a combiner of the second embodiment.

In addition, amplifier apparatus 210 also inputs modulation mode switching control signal S7 to a combiner 232. A specific configuration for combiner 232 is shown in FIG. 10. Combiner 232 is configured by connecting switches 234-1 to 234-N, low pass filters 235-1 to 235-N, and mode switches 236-1 to 236-N in a cascade at a stage after the down-samplers 231-1 to 231-N. A power supply voltage from power supply 140 and an output for a corresponding down-sampler 231-1 to 231-N is input to each switch 234-1 to 234-N. Each of the switches 234-1 to 234-N is operated to go on and off using an output from a corresponding down-sampler 231-1 to 231-N as a switching control signal. Specifically, in the event that an output from a corresponding down-sampler 231-1 to 231-N is a "High" level, one of the switches 234-1 to 234-N is on and supplies current from power supply to the low pass filter, and in the event of a "Low" level, is off and does not supply current from power supply to the low pass filter.

Variable bandwidth low pass filters are used as the low pass filters 235-1 to 235-N, and the band width of the low pass filters 235-1 to 235-N is controlled according to modulation mode switching control signal S7. Mode switches 236-1 to 236-N are operated on and off according to modulation mode switching control signal S7. Specifically, only mode switches 236-1 to 236-N corresponding to down-samplers 231-1 to 231-N that are not operating are operated to go off. In this way, leakage of current from lines corresponding to down-samplers 231-1 to 231-N that are not operating is prevented.

Next, a description is given of the operation of this embodiment centered mainly on the operation of polyphase down-sampler 230 of the power supply voltage control section 220.

Referring to FIG. 9, it is not necessary for the sampling rate of quantizer 122 to be a high speed with respect to a modulation scheme of a low modulation rate (for example, several tens of kbps) for the baseband amplitude modulation signal S2 and it is not necessary to increase the number of phases of polyphase down-sampler 230. The number of down-samplers from within down-samplers 231-1 to 231-N constituting polyphase down-sampler 230 that are actually operating is then controlled to be small using modulation mode switching control signal S7 and the band width of low pass filters 235-1 to 235-N is made narrow according to the modulation rate.

On the other hand, it is necessary for the sampling rate of quantizer 122 to be a high speed with respect to a modulation scheme of a high modulation rate (for example, several Mbps) for the baseband amplitude modulation signal S2 and it is necessary to increase the number of phases of polyphase down-sampler 230. The number of down-samplers from within down-samplers 231-1 to 231-N constituting polyphase down-sampler 230 that are actually operating is then controlled to be large using modulation mode switching control signal S7 and the band width of low pass filters 235-1 to 235-N is made broad according to the modulation rate.

According to this embodiment, in addition to the configuration of the first embodiment, by selecting (varying) the number of down-samplers actually operating from the plurality of down-samplers 231-1 to 231-N according to modulation mode, it is possible to share the power supply voltage control section 220 between a plurality of modulation schemes, and it is possible to implement amplifier apparatus 210 capable of appropriately setting the number of phases for polyphase down-sampler 230 according to the respective modulation schemes. In this way, at the amplifier apparatus 210 of this embodiment, it is possible to appropriately set the number of phases for the polyphase down-sampler 230 according to the respective modulation schemes. It is therefore possible to reduce the number of down-samplers 231-1 to 231-N operating in the case where modulation rate is low compared, for example, to cases where the modulation rate is high, and the current consumed can be reduced. It is therefore possible to implement a polar modulation transmission apparatus 200 compatible with a plurality of modulation schemes and capable of forming a transmission output signal S6 with superior characteristics while using a simple configuration by mounting this amplifier apparatus 210.

Further, according to this embodiment, it is possible to obtain a power supply voltage (in the case of this embodiment, delta modulation signal S5) of a bandwidth corresponding to the modulation scheme by selecting (varying) the bandwidth of low pass filters 235-1 to 235-N provided at a stage after down-samplers 231-1 to 231-N according to modulation mode.

In this embodiment, a description is given where a plurality of low pass filters 235-1 to 235-N are provided within combiner 232 and combining takes place while limiting the bandwidth of current outputted by switches 234-1 to 234-N according to modulation mode but this is by no means limiting, and it is also possible to collectively control the frequency band of this combined signal using a single variable low pass filter after combining the power supply voltages output from the switches 234-1 to 234-N.

Further, in this embodiment, a description is given where the bandwidth of variable low pass filters 235-1 to 235-N is set according to modulation rate, but it is not essential for the bandwidth of the low pass filters to be variable providing that the bandwidth of the low pass filters is set in such a manner as to cover all of the modulation schemes that may be employed.

Moreover, if the amplifier apparatus described in the first and second embodiments is used in wireless communication apparatus such as a mobile telephone, compared to the case of making a quantizer a multiphase configuration, it is possible to form a power supply voltage with superior characteristics as a power supply voltage for high-frequency power amplifier 130 using one quantizer. It is therefore possible to implement wireless communication apparatus capable of forming a high-quality transmission signal with a simple configuration. For example, in the case of application to a mobile telephone, it is possible to implement a compact mobile telephone capable of transmitting high-quality audio signals and data signals.

Figure 11:
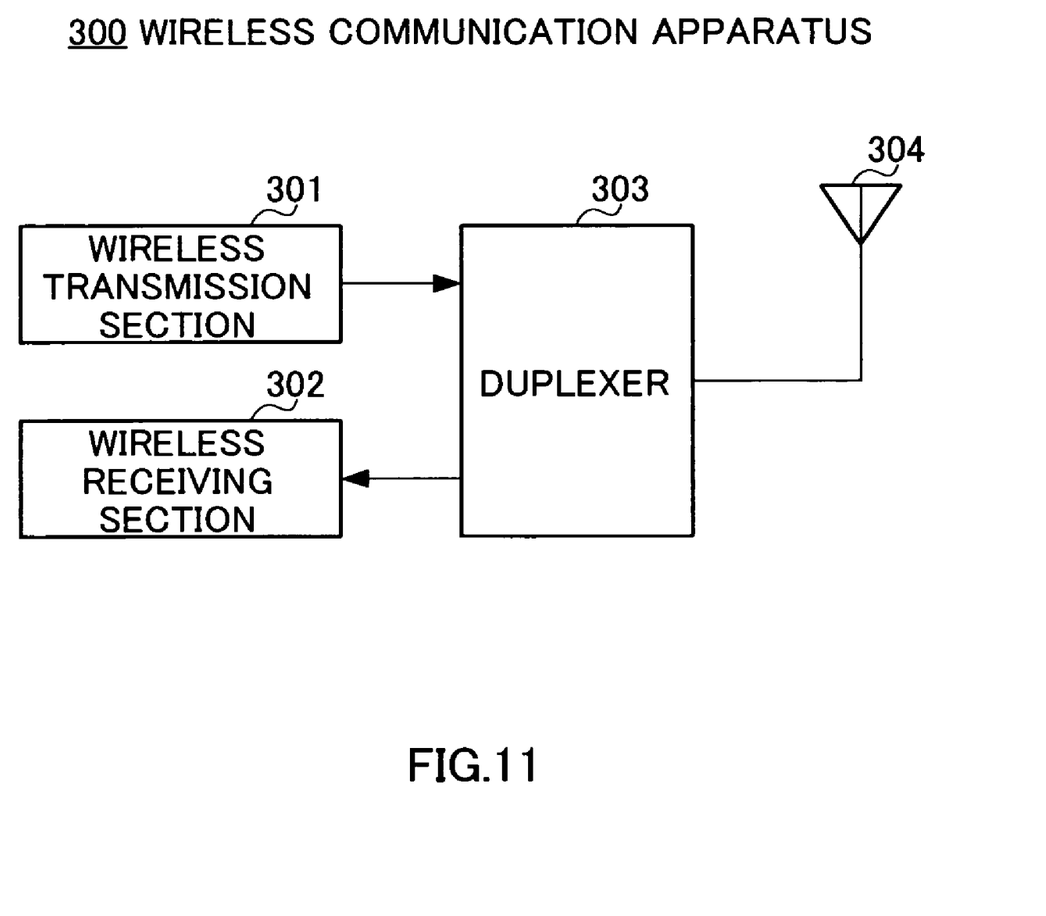
FIG. 11 is a block diagram showing an example configuration for a wireless communication apparatus mounted with an amplifier apparatus of the present invention.

An example configuration for a wireless communication apparatus to which amplifier apparatus of the present invention is applied is shown in FIG. 11. Wireless communication apparatus 300 is comprised of wireless transmission section 301 having polar modulation transmission apparatus 100 of the configuration of FIG. 6, wireless receiving section 302 carrying out predetermined receiving processing such as demodulation processing of received signals etc., antenna 304, and duplexer 303 for switching between supplying a transmission signal from wireless transmission section 301 to antenna 304 and supplying a received signal from antenna 304 to wireless transmission section 301. As a result, with wireless communication apparatus 300, it is possible to simplify the configuration of the wireless transmission section 301 and the overall apparatus can be made smaller.

Third Embodiment

Figure 12:
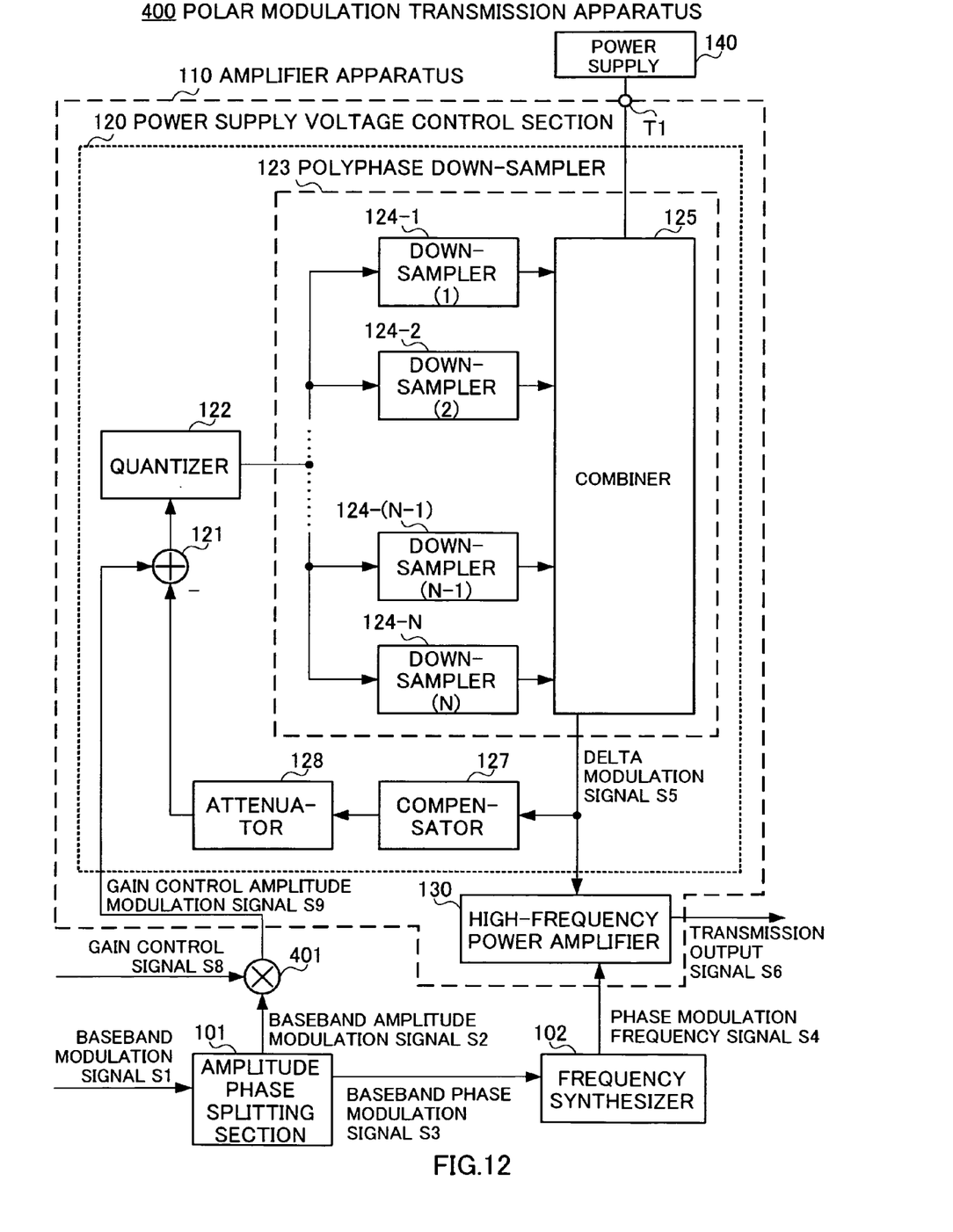
FIG. 12 is a block diagram showing a configuration for polar modulation transmission apparatus of a third embodiment of the present invention.

A configuration for a polar modulation transmission apparatus of a third embodiment is shown in FIG. 12, with parts corresponding to FIG. 6 being given the same numerals.

The configuration is the same as for the polar modulation transmission apparatus 100 of the first embodiment with the exception of polar modulation transmission apparatus 400 having a multiplier 401 multiplying baseband amplitude modulation signal S2 and gain control signal S8 and sending gain control amplitude modulation signal S9 constituting the result to adder 121 of power supply voltage control section 120.

As a result, at polar modulation transmission apparatus 400, in addition to the advantages of the first embodiment, it is possible to control the output level of the transmission output signal according to gain control signal S8.

In particular, in the event that gain control amplitude modulation signal S9 becomes smaller than gain control signal S8, the output of adder 121 is often in the vicinity of the threshold value of quantizer 122. Therefore, while deterioration in characteristics due to variations in characteristics of the plurality of quantizers becomes substantial in the case of using the polyphase quantizer of the related art, in this embodiment, the amplifier apparatus 110 described in the first embodiment is used, and this is therefore not a problem.

In the first to third embodiments described above, an aspect of an amplifier apparatus of the present invention employs a configuration where the amplifier apparatus is provided with a non-linear high-frequency power amplifier amplifying a first input signal and a power supply voltage control section inputted with an external power supply forming a power supply voltage for the high-frequency amplifier based on a second input signal, amplifying the signal level of the first input signal using the high-frequency power amplifier to a level corresponding to the second input signal. Here, the power supply voltage control section has a delta modulator configuration or a delta-sigma modulator configuration and is comprised of a quantizer quantizing a signal according to a signal level of the second input signal, a plurality of down-samplers down-sampling quantized outputs obtained from the quantizers at a lower speed than the sampling rate of the quantizers and with respective phases shifted, and a combiner combining outputs of the plurality of down-samplers.

An aspect of the amplifier apparatus of the present invention employs a configuration where the plurality of down-samplers are comprised of N down-samplers, and each down-sampler down-samples the quantized output at a speed of (1/N) of the sampling rate of the quantizer and with a phase shifted by (360/N) degrees.

According to these configurations, it is possible to carry out the same operation as for a polyphase quantizer with a single quantizer and a plurality of down-samplers. In addition, by using down-samplers of a simple circuit configuration compared to a quantizer, it is possible to suppress increases in circuit scale compared to the case of using polyphase quantizers. Further, as quantization is performed using only one quantizer, it is possible to suppress deterioration in characteristics due to variations in characteristics of the plurality of quantizers compared to the case of using polyphase quantizers.

An aspect of the amplifier apparatus of the present invention also employs a configuration where the combiner further comprises a plurality of switches input with the external power supply, giving an output of the power supply voltage being on and off using output signals of each down-sampler as switching signals, wherein the power supply voltage of the high-frequency power amplifier is formed by combining the current or voltage outputted by the plurality of switches.

According to this configuration, a large current power supply current is formed by a combiner at a stage after the quantizer, thereby simplifying the design of the quantizer. That is to say, in the configuration of the present invention, it is necessary for the quantizer to operate at a high sampling rate compared with the polyphase quantizer, but, rather than the output of the quantizer directly driving a high-frequency power amplifier, a configuration is provided such that the output of the quantizer is capable of driving a plurality of down-samplers, so that it is no longer necessary to switch the quantizer using a large current. As a result, large current operation is no longer required for the quantizer, thereby the trade off between large current operation and high speed operation and simplifying the design of the quantizer.

An aspect of an amplifier apparatus of the present invention also employs a configuration where the number of down-samplers made to operate, amongst a plurality of down-samplers, changes according to modulation mode.

According to this configuration, it is possible for the power supply voltage control section to be shared by a plurality of modulation schemes, and it is therefore possible to set the number of phases of the plurality of down-samplers in the most appropriate manner according to modulation schemes. As a result, it is possible to implement an amplifier apparatus that is compatible with a plurality of modulation schemes and for which power consumption is small.

One aspect of the amplifier apparatus of the present invention employs a configuration where a low pass filter is further provided at a stage after the down-samplers, and the pass bandwidth of the low pass filter changes according to modulation mode.

According to this configuration, it is possible to obtain a power supply voltage of a bandwidth corresponding to the modulation rate of the modulation scheme.

An aspect of a polar modulation transmission apparatus of the present invention employs a configuration where one of the aforementioned amplifier apparatus, an amplitude phase splitting section forming a baseband amplitude modulation signal and a baseband phase modulation signal based on a baseband modulation signal, and supplying the baseband amplitude modulation signal to the power supply voltage control section of the amplifier apparatus as the second input signal, and a frequency synthesizer forming a phase-modulated high-frequency signal by modulating a carrier frequency using the baseband phase modulation signal and supplying the phase-modulated high-frequency signal to the high-frequency power amplifier as the first input signal, are provided.

An aspect of a polar modulation transmission apparatus of the present invention employs a configuration where a multiplier forming a gain control amplitude modulation signal by multiplying the baseband amplitude modulation signal and the gain control signal and supplying the gain control amplitude modulation signal to the power supply voltage control section of the amplifier apparatus as the second input signal is further provided.

According to this configuration, it is possible to change the level of a transmission signal outputted by the high-frequency power amplifier according to a gain control signal.

An aspect of a wireless communication apparatus of the present invention employs a configuration where a wireless transmission section having a polar modulation transmission apparatus, a wireless receiving section demodulating a received signal, an antenna, and a transmit/receive switching section switching between supplying a transmission signal from the wireless transmission section to the antenna, and supplying a received signal from the antenna to the wireless receiving section are provided.

According to this configuration, it is possible to form a power supply voltage control signal with superior characteristics with one quantizer compared to the case of making a quantizer a multiphase configuration, and it is therefore possible to form a high-quality transmission signal with a simple configuration. As a result, for example, in the case of application to a mobile telephone, it is possible to implement a compact mobile telephone capable of transmitting high-quality audio signals and data signals.

The present invention is not limited to the above described embodiments, and various variations and modifications may be possible without departing from the scope of the present invention.

This application is based on Japanese Patent Application No. 2005-76898, filed on Mar. 17, 2005, the entire content of which is expressly incorporated by reference herein.

What is claimed is:

1. An amplifier apparatus, having a non-linear high-frequency power amplifier amplifying a first input signal and a power supply voltage control section receiving as input an external power supply forming a power supply voltage for the high-frequency amplifier based on a second input signal, amplifying the signal level of the first input signal using the high-frequency power amplifier to a level corresponding to the second input signal,
   the power supply voltage control section having a delta modulator configuration or a delta-sigma modulator configuration and comprising:
   a quantizer quantizing a signal according to a signal level of the second input signal;
   a plurality of down-samplers down-sampling quantized outputs obtained from the quantizer at a lower speed than a sampling rate of the quantizer and with respective phases shifted; and
   a combiner combining outputs of the plurality of down-samplers.

2. The amplifier apparatus according to claim 1, wherein the plurality of down-samplers comprise N down-samplers, and each down-sampler down-samples the quantized output at a speed of (1/N) of a sampling rate of the quantizer and with a phase shifted by (360/N) degrees.

3. The amplifier apparatus according to claim 1, wherein the combiner comprises a plurality of switches receiving as input the external power supply and giving an output of the power supply voltage being on and off using output signals of the down-samplers as switching signals,
   wherein the power supply voltage of the high-frequency power amplifier is formed by combining the current or voltage outputted by the plurality of switches.

4. The amplifier apparatus according to claim 1, wherein the number of down-samplers made to operate, amongst the plurality of down-samplers, changes according to modulation mode.

5. The amplifier apparatus according to claim 4, further comprising a low pass filter provided at a stage after the down-samplers,
   wherein the pass bandwidth of the low pass filter changes according to modulation mode.

6. A polar modulation transmission apparatus comprising:
   the amplifier apparatus according to claim 1;
   an amplitude phase splitting section forming a baseband amplitude modulation signal and a baseband phase modulation signal based on a baseband modulation signal, and supplying the baseband amplitude modulation signal to the power supply voltage control section of the amplifier apparatus as the second input signal; and
   a frequency synthesizer forming a phase-modulated high-frequency signal by modulating a carrier frequency using the baseband phase modulation signal and supplying the phase-modulated high-frequency signal to the high-frequency power amplifier as the first input signal.

7. The polar modulation transmission apparatus according to claim 6, further comprising a multiplier forming a gain control amplitude modulation signal by multiplying the baseband amplitude modulation signal and the gain control signal and supplying the gain control amplitude modulation signal to the power supply voltage control section of the amplifier apparatus as the second input signal.

8. A wireless communication apparatus comprising:
   a wireless transmission section having the polar modulation transmission apparatus according to claim 6;
   a wireless receiving section demodulating a received signal;
   an antenna; and
   a transmit/receive switching section switching between supplying a transmission signal from the wireless transmission section to the antenna and supplying the received signal from the antenna to the wireless receiving section.

* * * * *